(12) United States Patent
Yang et al.

(10) Patent No.: US 7,348,045 B2
(45) Date of Patent: *Mar. 25, 2008

(54) CONTROLLED DEPTH ETCHED DIELECTRIC FILM

(75) Inventors: Rui Yang, Austin, TX (US); Christopher G. Dunn, Austin, TX (US); Nathan P. Kreutter, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 74 days.

This patent is subject to a terminal disclaimer.

(21) Appl. No.: 10/235,465

(22) Filed: Sep. 5, 2002

(65) Prior Publication Data

US 2004/0046835 A1  Mar. 11, 2004

(51) Int. Cl.
*C09K 19/00* (2006.01)
*H05K 1/00* (2006.01)

(52) U.S. Cl. ............... 428/1.26; 174/254; 174/258
(58) Field of Classification Search ............ 428/209, 428/1.26; 174/258, 254, 268
See application file for complete search history.

(56) References Cited

U.S. PATENT DOCUMENTS

| | | | |
|---|---|---|---|
| 4,623,577 A * | 11/1986 | Hsiue et al. | 428/209 |
| 4,847,139 A * | 7/1989 | Wolf et al. | 428/209 |
| 5,219,640 A | 6/1993 | Gazit et al. | |
| 5,227,008 A | 7/1993 | Klun et al. | |
| 5,288,950 A | 2/1994 | Ushio et al. | |
| 5,296,558 A * | 3/1994 | Hood et al. | 525/425 |
| 6,124,004 A * | 9/2000 | Furuta et al. | 428/1.1 |
| 6,335,416 B1 | 1/2002 | Nojiri et al. | |
| 6,403,211 B1 * | 6/2002 | Yang et al. | 428/308.4 |
| 6,611,046 B2 * | 8/2003 | Yang | 257/622 |
| 2002/0137218 A1 | 9/2002 | Mian et al. | |
| 2003/0007292 A1 | 1/2003 | Himes et al. | |
| 2003/0094953 A1 | 5/2003 | Brooks et al. | |
| 2003/0103294 A1 | 6/2003 | Maruyama et al. | |

FOREIGN PATENT DOCUMENTS

| | | |
|---|---|---|
| EP | 0 388 312 | 9/1990 |
| JP | 3152132 | 6/1991 |
| JP | 2003-261699 A | 9/2003 |
| WO | WO99/19717 | 4/1999 |
| WO | WO 02/100135 A2 | 12/2002 |

OTHER PUBLICATIONS

International Search Report for PCT/US03/20722.

* cited by examiner

*Primary Examiner*—Cathy F. Lam
(74) *Attorney, Agent, or Firm*—Melanie G. Gover; Alan Ball

(57) ABSTRACT

A dielectric film for use as a substrate for a flexible circuit comprises a polymer selected from the group consisting of liquid crystal polymers and polyimide copolymers including carboxylic ester structural units in the polymeric backbone. The dielectric film has a thickness from about 25 μm to about 60 μm including at least one thinned, recessed region wherein the thickness is reduced to less than 15 μm, as required for use of the dielectric film in e.g. ink jet print head, hard disk drive head gimbal assembly and touch sensor applications.

4 Claims, No Drawings

CONTROLLED DEPTH ETCHED DIELECTRIC FILM

BACKGROUND OF THE INVENTION

1. Field of the Invention

The invention relates to dielectric film useful as a substrate for flexible printed circuits and more particularly to dielectric films including indented areas of controlled depth for devices requiring films having at least one area less than 20 μm thick for optimum device performance.

2. Description of the Related Art

An etched copper or printed polymer thick film circuit pattern over a polymer film base may be referred to as a flexible circuit or flexible printed wiring. Originally designed to replace bulky wiring harnesses, flexible circuitry is often the only solution for the miniaturization and movement needed for current, cutting-edge electronic assemblies. Thin, lightweight and ideal for complicated devices, flexible circuit design solutions range from single-sided conductive paths to complex, multilayer three-dimensional packages. The use of flexible circuits is known, for example, in electronic devices including ink jet print heads, hard disk drive suspension assemblies and touch or finger sensors.

Commonly used dielectric film base materials for flexible electronic packaging include polyimide, polyester terephthalate, random-fiber aramid and polyvinyl chloride. Changes in electronic device design create the need for materials with properties or design possibilities surpassing previously attainable performance and processing capabilities. For example, a lower dielectric constant allows faster electrical signal transfer, good thermal performance facilitates cooling for a package, a higher glass transition or melting temperature improves package performance at higher temperature, and lower moisture absorption leads to signal and data processing at higher and higher frequencies. Additional improvement in device performance could be achieved by selective reduction of dielectric film thickness, but a cost-effective method is required to achieve the desired substrate thinning.

Polyimide film is a commonly used substrate for flexible circuits that fulfill the requirements of complex, cutting-edge electronic assemblies. The film has excellent properties such as thermal stability and low dielectric constant. Liquid crystal polymer (LCP) films represent suitable materials as substrates for flexible circuits having improved high frequency performance, lower dielectric loss, and less moisture absorption than polyimide films.

Current flexible circuits typically use dielectric substrate materials more than 25 μm thick. Automated handling and processing of films less than 50 μm thick is known to be difficult and, therefore, not cost effective. Flexible circuits such as flex-on-suspension circuits for hard disk drive devices would provide improved device performance if the flexible dielectric substrate could be thinner. Substrates may have uniform thickness or, for some applications, may benefit from thinning of only selected regions of the substrate. Selective substrate thinning, applied to ink jet printing heads could lead to improved image resolution with reduction in thickness of the material in the regions used for print head nozzle formation.

Dielectric films less than 25 μm thick may be obtained commercially, but processing of such thin films, whether of uniform or variable thickness, via multi-step conventional flexible circuit processing, causes mechanical damage or film stretching at any step in the process. Known flexible circuit processing techniques may not be capable of providing specified flexible circuits using dielectric substrate materials less than 25 μm thick. For further improvement in device performance there is a need for flexible circuits, including regions thinner than 25 μm, which can be mass produced to economically acceptable standards of yield and quality.

SUMMARY OF THE INVENTION

The present invention provides flexible circuits of the type also referred to herein as dynamic flex circuits comprising composites of dielectric substrates and copper circuit features. Properties of materials and circuit design affect the number of flex cycles that a given circuit is able to withstand.

The thickness of the dielectric film substrate, for example, determines the level of difficulty associated with flex circuit processing and manufacture. If the film web is less than about 25 μm thick problems with material handling lead to difficulties in consistent manufacture of circuit structures. This problem may be reduced using substrates according to the present invention that have indented regions of controlled depth to provide localized areas having a film thickness as low as 5 μm. Typically the substrates are in the form of dielectric films having selectively thinned regions to satisfy the specific functional needs of devices for which the circuits are designed. Apart from the thinned regions the substrate film maintains its original thickness to thereby retain dimensional stability and desirable film processing characteristics.

One of the key benefits of flex circuits is their application as connectors in small electronic devices such as portable electronics where there is only limited space for connector routing. It will be appreciated that reduction in thickness of flex circuits or portions of flex circuits will lead to greater circuit flexibility. This increases versatility in the use of flex circuits particularly if the reduction in thickness of the dielectric substrate allows the circuits to be folded with minimum stress in the region of the fold.

Applications for highly flexible, dielectric film substrates having thinned regions include devices requiring folding or bending of a flex circuit such as in ink jet print heads, lap top and palm top computers, calculators, cellular phones, touch or finger sensors and suspension structures for hard disk drives and the like. Flexible circuits, for any of the devices previously mentioned, may include indented or recessed features in the substrate film. For use in inkjet applications, flexible circuits may be made using dielectric films from 25 μm or 50 μm thick. Reducing the thickness of the film circuit substrate to 12.5 μm or thinner, in the nozzle area of the ink jet printing head, allows formation of smaller laser ablated holes to provide inkjet nozzles that shoot smaller volume ink droplets to produce images of higher resolution than larger nozzles in thicker film print heads. Thinner regions of dielectric substrate reduce the volume of fluid that a laser ablated nozzle can hold. When the dielectric film is less than 15 μm thick, the droplet formed in the each ink jet nozzle has a size about 8 picoliters or less. The ability to form selectively thinned regions in a dielectric film creates an inkjet print head part having robust material properties in non-critical areas and desirably thin film in the location of a nozzle array.

In hard disk drive applications, a flexible circuit can be made from 25 μm film, but the portion of the flexible circuit in the head gimbal assembly area may advantageously have a thickness of 12.5 μm or less for better flexibility. Selective thinning of dielectric substrate films also provides advantages in sensor applications. A flexible circuit used in e.g. touch or finger sensor applications may be fabricated using dielectric films from 25 µm or 50 µm thick. The film thickness may be reduced to 12.5 µm or less to increase the sensor's sensitivity to pressure.

A benefit of producing flexible circuits including recessed, or thinner regions is the improvement in web handling during processing to make advanced circuit structures without incurring excessive manufacturing costs. The same web handling techniques may be used for dielectric films having recessed regions as would be used for films of the same but uniform thickness. For example, flexible circuits according to the present invention use standard dielectric film 25 µm or 50 µm thick. This allows implementation of conventional web handling for forming flexible printed circuits. During the multi-step circuit forming process the dielectric film may be selectively reduced in thickness, to form indented or recessed regions, at any stage in the manufacturing process sequence. If the step of film thinning occurs early in the manufacturing process, only selected areas of the film change in thickness while the bulk of the film retains its original thickness. This facilitates optimal film handling, particularly roll-to-roll automated film processing. Several methods may be contemplated for forming three-dimensional recesses in the dielectric substrate film including chemical etching, micro replication, laser ablation, ion or plasma etching, and similar processes. Processes including chemical etching, also referred to herein as chemical milling, are preferred for forming indented or recessed regions in flexible circuits comprising either polyimide or liquid crystal polymer substrates according to the present invention. Chemical milling techniques are appropriate for use with either batch or continuous manufacturing schemes for producing flexible printed circuits.

More particularly, the present invention provides a dielectric film for use as a substrate for a flexible circuit. The dielectric film comprises a polymer selected from the group consisting of liquid crystal polymers and polyimide copolymers including carboxylic ester units in the polymeric backbone. The dielectric film has a thickness less than 60 µm including thinned, recessed regions wherein the thickness is reduced to less than 15 µm.

One embodiment of the present invention provides a flexible circuit for use in an ink jet print head. The circuit comprises a dielectric film comprising a polymer selected from the group consisting of liquid crystal polymers and polyimide copolymers produced by reaction of monomers including p-phenylene bis(trimellitic acid monoester anhydride). The dielectric film has a thickness less than 60 µm including at least one thinned, recessed region wherein the thickness is reduced to less than 15 µm. The recessed region includes at least one orifice to provide a print head nozzle sized to deliver ink drops having a volume less than about 8.0 picoliters.

Another embodiment of the present invention provides a flexible circuit for use in a touch sensor. The circuit comprises a dielectric film comprising a polymer selected from the group consisting of liquid crystal polymers and polyimide copolymers produced by reaction of monomers including p-phenylene bis(trimellitic acid monoester anhydride). The dielectric film has a thickness less than 60 µm including at least one thinned, recessed region to provide a touch sensitive membrane wherein the thickness is reduced to less than 15 µm. Hard disk drive head gimbal assemblies may also include dielectric films less than 15 µm thick.

Unless otherwise stated, concentrations of components are presented herein in terms of wt %.

DETAILED DESCRIPTION OF THE INVENTION

As required, details of the present invention are disclosed herein; however, it is to be understood that the disclosed embodiments are merely exemplary. Therefore, specific structural and functional details disclosed herein are not to be interpreted as limiting, but merely as a basis for the claims and as a representative basis for teaching one skilled in the art to variously employ the present invention.

The present invention provides dielectric films as substrates for composite circuits that include a flexible dielectric substrate film and copper conductive traces. Composite circuit durability, in terms of flex cycles, depends upon circuit thickness and other material properties. Conventional handling techniques for the manufacture of composite circuits, also referred to herein as flex circuits or dynamic flex circuits, require dielectric film substrates at least 25 µm thick. Films of uniform thickness less than 25 µm tend to irreversibly stretch or otherwise distort during the multi-step process of printed circuit production. This problem may be overcome using dielectric films according to the present invention in which selective thinning provides specific regions that are less than 25 µm thick. After processing, the dielectric films have at least one indentation or region of controlled depth formed therein.

Formation of indentations, also referred to herein as recesses, creates changes of thickness in areas of the dielectric films that contain a recessed region. The existence of recesses of controlled depth contributes to improvement in several applications that require the beneficial properties of flexible printed circuits. For example, in hard disk drive applications, the main portion of a flexible circuit may be made from 25 µm dielectric film. Reduction in thickness to about 15 µm provides a dielectric substrate having reduced stiffness in the head-gimbal assembly region of the circuit. The reduction in stiffness minimizes the influence of a dielectric film, such as liquid crystal polymer or polyimide, on the mechanical attributes of the hard disk drive suspension. Reduction of the influence of the dielectric film leads to less variation in the fly height of the read/write head. This increases signal strength, enabling greater signal areal density, which allows for larger memory capacity. Film thinning also facilitates the use of a lower power motor in very power sensitive portable hard drives.

In inkjet applications, flexible circuits made from either 25 µm or 50 µm thick dielectric films, may be thinned in the nozzle area to 15 µm or less to allow laser ablation of ink jet print head nozzles having volumes smaller than those currently achievable. As the volume of the ink jet print head nozzle decreases there is an increase in resolution of images produced by ink jet printers due to use of smaller ink droplets. The smaller droplets result from selective thinning of dielectric film and laser ablation of lower volume inkjet nozzles that shoot ink drops smaller than those formed using thicker dielectric films. Reduction of film thickness in a specific area in the region of the nozzle array produces a flexible part having relatively robust material properties in other areas of the ink jet print head. Selectively thinned flexible circuits enable connectivity in confined locations requiring that the flex form fit in locations that include acute angle bends. Added flexibility creates less stress on flex circuits used for ink jet applications in which 90° bends are common.

The sensitivity of touch or finger sensors may be increased by selective thinning of flex circuits that initially use a dielectric substrate between 25 µm and 50 µm thick.

Using film processing techniques, according to the present invention, the dielectric film thickness may be selectively reduced to 15 μm or less in the sensor pressure area. This introduces a thin film membrane that is more sensitive to touch than the thicker film regions that surround it.

The term "dynamic flex" has been used to describe flexible circuits used for applications of the type described previously. Other specific dynamic flex applications include, lap top computers, personal digital assistants, cell phones, calculators, and any device that has a display with an interface that bends or folds. A key advantage of flex is its effective use where space for device interconnection is very limited. Reduced dielectric film thickness allows flex to bend or fold at relatively sharp angles associated with stacked memory chips.

Selectively thinned portions of flex circuits may be designed to produce stacked structures, which require the dielectric film to bend conformably around interconnected electronic components.

Thinning of dielectric films, used to facilitate film folding, may also be used to create channels in dielectric substrates. Articles including channels and electric circuits provide a way to introduce microfluidics into electronic packages. It is conceivable to use MEMS devices, connected through the flex circuit, to analyze chemical fluids and analytes flowing through the channels formed in the circuit substrate. An analytical device of this type could provide channels of controlled depth on the same substrate as the electrical circuit. Use of photolithography, in this case, allows design freedom and very precise alignment and positioning of device features.

Processing of flex circuits according to the present invention has similarities to the process of U.S. Pat. No. 5,227,008 that describes processing of polyimide films to produce through holes, such as vias, and related voids. This patent and the present application are commonly owned. Etching capabilities to produce flexible printed circuits having selectively formed indented regions require specification of materials and process capabilities not previously disclosed. For example, although polyimide is the most frequently used substrate material used in the manufacture of flexible circuits, patterning of dielectric substrates is primarily accomplished by such process steps as mechanical punching or drilling and laser ablation. As described in U.S. Pat. No. 5,227,008 it is possible to produce chemically etched vias and through holes in flexible polyimide circuits, as needed for electrical interconnection between the circuit and a printed circuit board. Complete removal of polyimide material, for hole formation, is relatively common. Controlled etching without hole formation is very difficult when commonly used polyimide films swell uncontrollably in the presence of conventional etchant solutions. Most commercially available polyimide film comprises monomers of pyromellitic dianhydride (PMDA), or oxydianiline (ODA), or biphenyl dianhydride (BPDA), or phenylene diamine (PPD). Polyimide polymers including one or more of these monomers may be used to produce film products designated as KAPTON™ H, K, E films (available from E. I. du Pont de Nemours and Company, Circleville, Ohio) and APICAL™ AV, NP films (available from Kaneka Corporation, Otsu, Japan). Films of this type swell in the presence of conventional chemical etchants. Swelling changes the thickness of the film and may cause localized delamination of resist. This can lead to loss of control of etched film thickness and irregular shaped features due to etchant migration into the delaminated areas.

Etching of films to introduce recesses and other regions of controlled thickness requires the use of a film that does not swell in the presence of alkaline etchant solutions. Controlled thinning of films, according to the present invention, may use substantially non-swelling polymers. In contrast to other known polyimide films there is evidence to show controllable thinning of APICAL™ HPNF films (available from Kaneka Corporation, Otsu, Japan). Films of liquid crystal polymers, which exhibit this property, comprise aromatic polyesters including copolymers containing p-phenyleneterephthalamide such as BIAC film (Japan Gore-Tex Inc., Okayama-Ken, Japan) and copolymers containing p-hydroxybenzoic acid such as LCP CT film (Kuraray Co., Ltd., Okayama, Japan). A similarity between liquid crystal polymers and APICAL™ HPNF polyimide is the presence of carboxylic ester units in both types of polymer structures. The existence of carboxylic ester structural units in the polymeric backbone of non-swelling APICAL™ HPNF film signifies a difference between this polyimide and other polyimide polymers that are known to swell in contact with alkaline etchants.

APICAL™ HPNF polyimide film is believed to be a copolymer that derives its ester unit containing structure from polymerizing of monomers including p-phenylene bis(trimellitic acid monoester anhydride). Other ester unit containing polyimide polymers are not known commercially. However, to one of ordinary skill in the art, it would be reasonable to synthesize other ester unit containing polyimide polymers depending upon selection of monomers similar to those used for APICAL™ HPNF. Such syntheses could expand the range of polyimide polymers for films, which, like liquid crystal polymers and APICAL™ HPNF, may be controllably etched. Materials that may be selected to increase the number of ester containing polyimide polymers include 1,3-diphenol bis(anhydro-trimellitate), 1,4-diphenol bis(anhydro-trimellitate), ethylene glycol bis(anhydro-trimellitate), biphenol bis(anhydro-trimellitate), oxy-diphenol bis(anhydro-trimellitate), bis(4-hydroxyphenyl sulfide) bis(anhydro-trimellitate), bis(4-hydroxybenzophenone) bis(anhydro-trimellitate), bis(4-hydroxyphenyl sulfone) bis(anhydro-trimellitate), bis(hydroxyphenoxybenzene), bis(anhydro-trimellitate), 1,3-diphenol bis(aminobenzoate), 1,4-diphenol bis(aminobenzoate), ethylene glycol bis(aminobenzoate), biphenol bis(aminobenzoate), oxy-diphenol bis(aminobenzoate), bis(4 aminobenzoate) bis(aminobenzoate), and the like.

Dielectric substrates, such as liquid crystal polymer and polyimide films having a thickness between about 25 μm and 50 μm thick, provide suitable starting materials for circuits having recessed regions. Materials in this thickness range are suitable for handling by equipment used to produce conventional flexible circuits of the type described in U.S. Pat. No. 5,227,008. According to the present invention, the dielectric film may be selectively chemically etched at several stages in the flexible circuit manufacturing process. Introduction of an etching step early in the production sequence effects thinning of only selected areas of the film while leaving the bulk of the film at its original thickness. Alternatively, thinning of selected areas of the film later in the flexible circuit manufacturing process has the benefit of introducing other circuit features before altering film thickness. Regardless of when selective substrate thinning occurs in the process, film-handling characteristics remain similar to those associated with the production of conventional flex circuits.

Possible alternative methods may be used for creating three-dimensional structures in the dielectric substrate film including micro replication of thermoplastic films, laser ablation, ion or plasma etching or similar processes. Such methods are generally less effective than chemical etching for selectively thinned circuit manufacture according to the present invention. Micro-replication, for example, before flexible circuit manufacture, may produce bulk film non-uniformities. Application of this method after preparation of other circuit features may destabilize the circuit pattern or change properties of the material that requires softening to emboss a desired pattern into the circuit substrate. Further, processes involving ion or plasma etching may be difficult to control and it is anticipated that laser ablation is likely to be uneconomical.

Process steps for selectively and controllably thinning materials according to the present invention include etching of substantially fully cured polymeric films of liquid crystal polymers and polyimide polymers containing carboxylic ester units, e.g., using p-phenylene bis(trimellitic acid monoester anhydride) as a comonomer. The etching step of the process involves contacting unmasked areas of the polymeric film with a concentrated alkaline etching fluid. Useful alkaline etchants include aqueous solutions of alkali metal hydroxides and their mixtures with amines, as described in U.S. Pat. Nos. 5,227,008 and 6,403,211 B1 for introducing holes and related voids into dielectric films. Time requirements for controlled thinning of dielectric film depend upon the type and thickness of the polymeric film. Film etching, using an alkaline etchant heated between 50° C. and 120° C. typically requires a time from about 10 seconds to about 20 minutes.

Flexible circuit fabrication comprises the step of etching, described above, in conjunction with various pre-etching and post-etching procedures. The sequence of process steps is application dependent. In one typical process, aqueous processable photoresist material, applied to both sides of a copper-on-polymeric film laminate, becomes crosslinked during exposure to a pattern of ultraviolet radiation or the like, through a mask. The exposed photoresist is then developed using a dilute aqueous solution, e.g. a 0.5% to 1.5% alkali metal carbonate solution, until desired patterns are developed on both sides of the laminate. As required, the copper side of the laminate may be plated to a desired thickness. The process continues with immersion of the laminate in a bath of concentrated alkaline etchant solution at a temperature between 50° C. and 120° C. This etches selected areas not covered by crosslinked resist to produce through holes and related voids in the polymeric film. The residence time in the etchant bath, to produce through holes in the laminate is from about 10 seconds to about 20 minutes. A dilute aqueous solution, containing from 2% to 5% alkali metal carbonate, may be used at temperatures from about 20° C. to about 80° C., preferably about 20° C. to about 60° C., to strip crosslinked resist from both sides of the laminate, after which copper circuit traces may be etched using a copper specific etchant.

Recessed regions may be introduced into the polymer film as an additional step after completing other features of the flex circuit. The additional step requires lamination of photoresist to both sides of the flexible circuit followed by exposure to crosslink the photoresist according to a selected pattern. Development of the photoresist, using the dilute solution of alkali metal carbonate described previously, exposes areas of the dielectric film that will be etched to controlled depths to produce indentations and associated thinned regions of film. The thinning process is referred to herein as chemical etching or chem milling. After allowing sufficient time to etch recesses of desired depth into the dielectric substrate of the flex circuit, the protective crosslinked photoresist is stripped as before, and the resulting circuit, including selectively thinned regions, is rinsed clean.

It is possible to introduce regions of controlled thickness into the dielectric film of the flex circuit using controlled chemical etching either before or after the etching of through holes and related voids that completely removes dielectric polymer materials as required to introduce conductive pathways through the circuit film. The step introducing standard voids in a printed circuit occurs about mid-way through the circuit manufacturing process. It is convenient to complete film etching in approximately the same time frame by including one step for etching all the way through the substrate and a second etching step for etching recessed regions of controlled depth. This may be accomplished by suitable use of photoresist, crosslinked to a selected pattern by exposure to ultraviolet radiation. Upon development, removal of photoresist reveals areas of dielectric film that will be etched to introduce recessed regions.

The process steps described above may be conducted as a batch process using individual steps or in automated fashion using equipment designed to transport a web material through the process sequence from a supply roll to a wind-up roll, which collects mass produced circuits that include selectively thinned regions and indentations of controlled depth in the polymer film. Automated processing uses a web handling device that has a variety of processing stations for applying, exposing and developing photoresist coatings, as well as etching and plating the metallic parts and etching the polymer film of the starting metal to polymer laminate. Etching stations include a number of spray bars with jet nozzles that spray etchant on the moving web to etch those parts of the web not protected by crosslinked photoresist.

Materials

Dielectric Film Substrates

1. APICAL™ HPNF—film (25 micron and 50 micron film) is produced by Kaneka Corporation, Otsu, Japan
2. BIAC film—Liquid crystal polymer (LCP) film 25 μm thick is produced by Japan Gore-Tex Inc., Okayama-Ken, Japan
3. LCP CT film—Liquid crystal polymer (LCP CT) film 50 μm thick is produced by Kuraray Co., Ltd., Okayama, Japan Photoresist A dry film photoresist was used for selective location of regions for controlled etching. The photoresist material is available from MacDermid Inc. of Waterbury, Conn. under product numbers SF 310, SF 315 or SF 320.

Etchant Compositions

A) 33 wt % potassium hydroxide+19 wt % methylethylamine+48 wt % de-ionized water.
B) 45 wt % potassium hydroxide+55 wt % de-ionized water.
C) 35 wt % potassium hydroxide+15 wt % methylethylamine+50 wt % de-ionized water.

Automated Processing for Controlled Film Thickness, Examples 1–3

Table 1 provides evidence that 25 μm liquid crystal polymer film and 50 μm polyimide film comprising a polymer derived from p-phenylene bis(trimellitic acid monoester anhydride) monomer can be handled using conventional automated equipment for producing flexible circuits. During the flexible circuit production process, the etchants indicated in the table were sprayed automatically for controlled thinning of regions of film that were exposed by selective removal of photoresist. This produced recessed areas having a film thickness that was reduced to 25% to 50% of the original film thickness.

TABLE 1

Automated Roll-to-Roll Film Processing

|  | Example 1 | Example 2 | Example 3 |
|---|---|---|---|
| Film (thickness) | LCP (25 µm) | APICAL ™ HPNF (50 µm) | APICAL ™ HPNF (50 µm) |
| Etchant | A | B | C |
| Temperature | 71° C. | 93° C. | 82° C. |
| Line Speed | 38 cm/min | 41 cm/min | 102 cm/min |
| Thickness After Etching | 12.5 µm | 12.0 µm | 11.0 µm |

Batch Processing for Controlled Film Thickness, Example 4 and Example 5

Table 2 provides evidence that 50 µm polyimide film comprising a polymer derived from p-phenylene bis(trimellitic acid monoester anhydride) can be selectively reduced in thickness to less than 50% of its original thickness. During the flexible circuit production process, the film (APICAL™ HPNF) was immersed in an aqueous solution containing 45% potassium hydroxide for the times indicated to produce regions controllably thinned where the film was exposed by selective removal of photoresist.

TABLE 2

Batch Film Processing

|  | Example 4 | Example 5 |
|---|---|---|
| Film (thickness) | APICAL ™ HPNF (50 µm) | APICAL—™ HPNF (50 µm) |
| Etchant | B | B |
| Temperature | 93° C. | 93° C. |
| Time | 2.0 min | 2.5 min |
| Thickness After Etching | 14.0 µm | 7.0 µm |

A dielectric film for use as a substrate for a flexible circuit has been described herein including selectively recessed regions wherein the dielectric film thickness has been controllably reduced from about 5% to about 50% of its original thickness. It will be appreciated by those of skill in the art that, in light of the present disclosure, changes may be made to the embodiments disclosed herein without departing from the sprit and scope of the present invention.

What is claimed is:

1. A flexible circuit for use in a touch sensor, said circuit comprising:
   a dielectric film comprising a polymer selected from the group consisting of liquid crystal polymers and polyimide copolymers including carboxylic ester structural units in the polymeric backbone, said dielectric film having an initial thickness from about 25 µm to about 60 µm including at least one recessed region that will form a touch sensitive membrane wherein said thickness of said recessed region is reduced to a controlled depth of less than 15 µm, wherein said polyimide copolymers comprise the reaction product of monomers including p-phenylene bis(trimellitic acid monoester anhydride) and wherein said liquid crystal polymers are selected from the group consisting of copolymers containing p-phenyleneterephthalamide and copolymers containing p-hydroxybenzoic acid.

2. A flexible circuit for use in a head gimbal assembly of a hard disk drive, said circuit comprising:
   a dielectric film comprising a polymer selected from the group consisting of liquid crystal polymers and polyimide copolymers including carboxylic ester structural units in the polymeric backbone, said dielectric film having a thickness from about 25 µm to about 60 µm including at least one recessed region wherein said thickness is reduced to a controlled depth of less than 15 µm, said at least one recessed region including at least one orifice to provide a print head nozzle sized to deliver ink drops having a particle size less than about 8.0 picoliters.

3. The dielectric film of claim 2, wherein said liquid crystal polymers are selected from the group consisting of copolymers containing p-phenyleneterephthalamide and copolymers containing p-hydroxybenzoic acid.

4. The dielectric film of claim 2, wherein said polyimide copolymers comprise the reaction product of monomers including p-phenylene bis(trimellitic acid monoester anhydride).

* * * * *

UNITED STATES PATENT AND TRADEMARK OFFICE
CERTIFICATE OF CORRECTION

PATENT NO. : 7,348,045 B2  Page 1 of 1
APPLICATION NO. : 10/235465
DATED : March 25, 2008
INVENTOR(S) : Rui Yang It is certified that error appears in the above-identified patent and that said Letters Patent is hereby corrected as shown below:

Column 10,
Lines 28-29, in claim 2, delete "a head gimbal assembly of a hard drive," and insert -- an ink jet print head, -- therefore.

Signed and Sealed this

Twenty-first Day of October, 2008

JON W. DUDAS
*Director of the United States Patent and Trademark Office*